United States Patent
Su

(10) Patent No.: US 12,127,331 B2
(45) Date of Patent: Oct. 22, 2024

(54) CIRCUIT BOARD FOR HIGH FREQUENCY TRANSMISSION AND SHIELDING METHOD

(71) Applicant: GUANGZHOU FANGBANG ELECTRONICS CO., LTD, Guangzhou (CN)

(72) Inventor: Zhi Su, Guangzhou (CN)

(73) Assignee: Guangzhou Fangbang Electronics Co., Ltd, Guangzhou (CN)

( * ) Notice: Subject to any disclaimer, the term of this patent is extended or adjusted under 35 U.S.C. 154(b) by 424 days.

(21) Appl. No.: 17/617,221

(22) PCT Filed: Dec. 17, 2019

(86) PCT No.: PCT/CN2019/125925
§ 371 (c)(1),
(2) Date: Dec. 7, 2021

(87) PCT Pub. No.: WO2021/004011
PCT Pub. Date: Jan. 14, 2021

(65) Prior Publication Data
US 2022/0240372 A1 Jul. 28, 2022

(30) Foreign Application Priority Data
Jul. 8, 2019 (CN) .......................... 201910611393.2

(51) Int. Cl.
*H05K 1/02* (2006.01)
*H05K 9/00* (2006.01)

(52) U.S. Cl.
CPC ......... *H05K 1/0218* (2013.01); *H05K 9/0073* (2013.01); *H05K 2201/0715* (2013.01)

(58) Field of Classification Search
CPC ..................................... H05K 1/0216–1/0227
See application file for complete search history.

(56) References Cited

U.S. PATENT DOCUMENTS 6,000,120 A * 12/1999 Arledge ................ H01P 11/005
333/238
2007/0181996 A1 8/2007 Chang et al.

FOREIGN PATENT DOCUMENTS

| CN | 105636336 A | 6/2016 |
| CN | 108770214 A | 11/2018 |
| CN | 109215859 A | 1/2019 |

OTHER PUBLICATIONS

International Search Report, PCT/CN2019/125925, Date of mailing of the International Search Report: Apr. 9, 2020.

\* cited by examiner

*Primary Examiner* — Jeremy C Norris
(74) *Attorney, Agent, or Firm* — Flener IP & Business Law; Zareefa B. Flener

(57) ABSTRACT

The present disclosure provides a circuit board for high frequency transmission and a shielding method. The circuit board for high frequency transmission includes: a first shielding film, a second shielding film and a circuit board body. The circuit board body includes a first surface and a second surface that are arranged opposite to each other. The first shielding film covers the first surface, and the second shielding film covers the second surface. The circuit board body is provided with a wire region. The first shielding film and the second shielding film are in electrical connection at a lateral side of the wire region. Therefore, leaky waves at the lateral side of the circuit board body are effectively avoided, and the circuit board body is thin in structure.

20 Claims, 13 Drawing Sheets

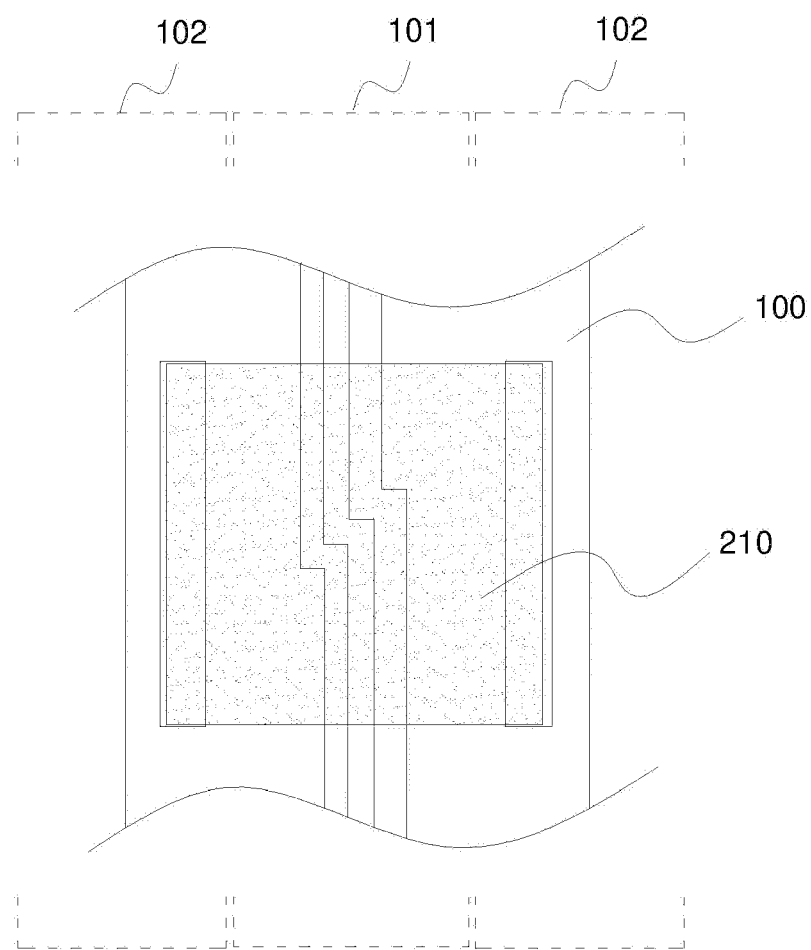

CIRCUIT BOARD FOR HIGH FREQUENCY TRANSMISSION AND SHIELDING METHOD

CROSS-REFERENCE TO RELATED APPLICATION(S)

This application claims priority to Chinese patent application No. 201910611393.2, filed to the China National Intellectual Property Administration on Jul. 8, 2019, the disclosure of which is hereby incorporated by reference in its entirety.

TECHNICAL FIELD

The present disclosure belongs to the field of electronic communication, for example, relates to a circuit board for high frequency transmission and a shielding method.

BACKGROUND

With the development of electronic and communication products towards multi-function and complexity, a structure of a circuit board is required to be lighter, thinner, shorter, and smaller. Stronger functions and high speed signal transmission are further required. In order to satisfy the above requirements of the circuit board, working frequencies are getting higher and higher. However, with the increasing of the working frequencies, leaky waves may occur on two sides of the circuit board, causing a signal to not be completely transmitted, so that the integrity of signal transmission is strongly influenced, resulting in signal distortion.

Summary

Some embodiments of the present disclosure provide a circuit board for high frequency transmission and a shielding method. Thus, leaky waves at a lateral side of a circuit board body are effectively avoided, the integrity of signal transmission is guaranteed, and thin structure is realized.

A technical solution includes as follows.

In some embodiments, a circuit board for high frequency transmission includes a first shielding film, a second shielding film, and a circuit board body. The circuit board body includes a first surface and a second surface that are arranged opposite to each other. The first shielding film covers the first surface, and the second shielding film covers the second surface. The circuit board body is provided with a wire region. The first shielding film and the second shielding film are in electrical connection at a lateral side of the wire region.

A junction of the first shielding film and the second shielding film may not be located in the center of a cross section of the circuit board body. The connection of the first shielding film and the second shielding film at the lateral side of the wire region includes the following.

The first shielding film crosses an edge of the first surface, and the second shielding film crosses an edge of the second surface, so as to make the first shielding film to be connected with the second shielding film; or the first shielding film is connected with the second shielding film after crossing the edge of the first surface and the edge of the second surface; or the second shielding film is connected with the first shielding film after crossing the edge of the second surface and the edge of the first surface. As long as the first shielding film and the second shielding film are connected to wrap the lateral side of the circuit board body so as to avoid leaky waves. Edges of the first surface and the second surface include a boundary of the entire wire region and an edge of an opening on the circuit board body. The connection of the first shielding film and the second shielding film at the lateral side of the wire region includes external connection protruding out of the boundary of the entire wire region, or internal connection protruding out of the edge of the opening on the circuit board body.

The operation that the first shielding film covers the first surface of the circuit board body includes as follows. The first shielding film covers a part of the first surface; or the first shielding film covers the entire first surface; or the first shielding film not only covers the entire first surface but also protrudes out of the boundary of the first surface; or the first shielding film covers a part of the first surface, and a part of the first shielding film protrudes out of the boundary of the first surface. The operation that the second shielding film covers the second surface of the circuit board body includes as follows. The second shielding film covers a part of the second surface; or the second shielding film covers the entire second surface; or the second shielding film not only covers the entire second surface but also protrudes out of the boundary of the second surface; or the second shielding film covers a part of the second surface, and a part of the second shielding film protrudes out of the boundary of the second surface.

In some embodiments, the circuit board body further includes a transition portion. An end of the transition portion is connected to the wire region, and another end of the transition portion is a free end. A thickness of at least one part of the transition portion is less than a thickness of the wire region.

In some embodiments, the transition portion is provided with a smooth transition surface.

In some embodiments, the first shielding film is connected with the second shielding film in a manner of bonding.

In some embodiments, the circuit board body further includes a blank region. The blank region is provided with an opening. The opening communicates the first surface and the second surface. The first shielding film is electrically connected with the second shielding film through the opening.

In some embodiments, a junction of the first shielding film and the second shielding film is accommodated in the opening.

In some embodiments, the first shielding film covers surfaces of the wire region and the blank region, and is connected with the second shielding film at the opening; or/and, the second shielding film covers the surfaces of the wire region and the blank region, and is connected to the first shielding film at the opening. In some embodiments, the circuit board body is provided with more than two wire regions. The blank region is disposed between the wire regions, and is provided with the opening. The first shielding film and the second shielding film cover the more than two wire regions. The first shielding film is connected with the second shielding film through the opening.

In some embodiments, a circuit board for high frequency transmission includes a circuit board body and a shielding film. The circuit board body includes a main wire layer and a conductor layer. The main wire layer is provided with a third surface and a fourth surface that are arranged opposite to each other. The conductor layer is disposed on the fourth surface. The main wire layer is provided with an opening. The third surface communicates with the conductor layer through the opening. The shielding film covers the third surface, and extends into the opening to be electrically connected with the conductor layer.

In some embodiments, a shielding method for a circuit board for high frequency transmission includes: covering a first shielding film on a first surface of a circuit board body; covering a second shielding film on a second surface of the circuit board body; and electrically connecting the first shielding film and the second shielding film at a lateral side of a wire region of the circuit board body. The operation of covering the first shielding film on the first surface of the circuit board body and the operation of covering the second shielding film on the second surface of the circuit board body are in a random order.

In some embodiments, a blank region of the circuit board body is provided with an opening configured to communicating the first surface and the second surface. The first shielding film is connected with the second shielding film through the opening.

In some embodiments, before the first shielding film is connected with the second shielding film, the opening is processed in the blank region.

In some embodiments, the first shielding film protrudes out of an edge of the circuit board body. The second shielding film protrudes out of the edge of the circuit board body. The first shielding film and the second shielding film are in electrical connection at a lateral side of the circuit board body.

In some embodiments, the first shielding film is connected with the second shielding film through bonding.

The beneficial effects of the present disclosure are as follows.

1. The first shielding film and the second shielding film are in electrical connection at a lateral side of the wire region of the circuit board body. In this way, a barrier is formed at the lateral side of the wire region, so as to avoid leaky waves at the lateral side of the wire region, thereby guaranteeing the integrity of signal transmission. Through a manner that the first shielding film and the second shielding film are in connection at the lateral side of the wire region after wrapping the circuit board body, convenient manufacturing is achieved.

2. The first shielding film and the second shielding film are viscous. "The operation of bonding the first shielding film and the second shielding film, the operation of bonding the first shielding film to the first surface, and the operation of bonding the second shielding film to the second surface" are simultaneously performed, which all belong to a "bonding" process (that is, including normal temperature and pressure bonding, heating bonding, or pressure bonding). The process is simple. The first shielding film and the second shielding film may be directly bonded without other operation after the first shielding film and the second shielding film are bonded on the circuit board body. Therefore, simple process and high production efficiency are realized.

3. All openings may be simultaneously processed. The first shielding film and the second shielding film are covered. Then, the first shielding film and the second shielding film in the openings are pressed (that is, pressure bonding). In this way, mass production and high efficiency are achieved. In addition, the circuit board body is clamped between the pressed first shielding film and second shielding film, so that the first shielding film and the second shielding film are fixed on the circuit board body. On the other hand, through the manner of viscous pressing, convenient production and high efficiency are achieved.

BRIEF DESCRIPTION OF THE DRAWINGS

FIG. 7-1 is a schematic structural diagram of a circuit board body being a multilayer board according to the first embodiment of the present disclosure.

FIG. 7-2 is a schematic structural diagram of a circuit board body being a single sided board according to the first embodiment of the present disclosure.

FIG. 7-3 is a schematic structural diagram of a circuit board body being a double sided board according to the first embodiment of the present disclosure.

FIG. 8 is a top view of FIG. 7.

FIG. 10-1 is a schematic diagram I of steps of a shielding method for a circuit board for high frequency transmission according to a third embodiment of the present disclosure.

FIG. 10-2 is a schematic structural diagram of a modification of FIG. 10-1.

REFERENCE NUMERALS

100. Circuit board body, 101. Wire region, 102. Blank region, 103. First surface, 104. Second surface, 110. Opening, 120. Transition portion, 121. Smooth transition surface;

201a and 201b. Conductive adhesive layer, 202a and 202b. Conductive layer, 203a and 203b. Insulation layer, 210. First shielding film, 220. Second shielding film, 230. Shielding film;

300. Function layer, 310. First protective film, 320. Second protective film, 330. Second insulation layer, 340. First insulation layer, 350. Wire layer;

400. Main wire layer, 403. Third surface, 404. Fourth surface;

500. Conductor layer.

DETAILED DESCRIPTION OF THE EMBODIMENTS

The present disclosure is described in detail below, but implementations of the present disclosure are not limited herein.

Embodiment I

As shown in FIG. 1 to FIG. 8.

Figure 1:
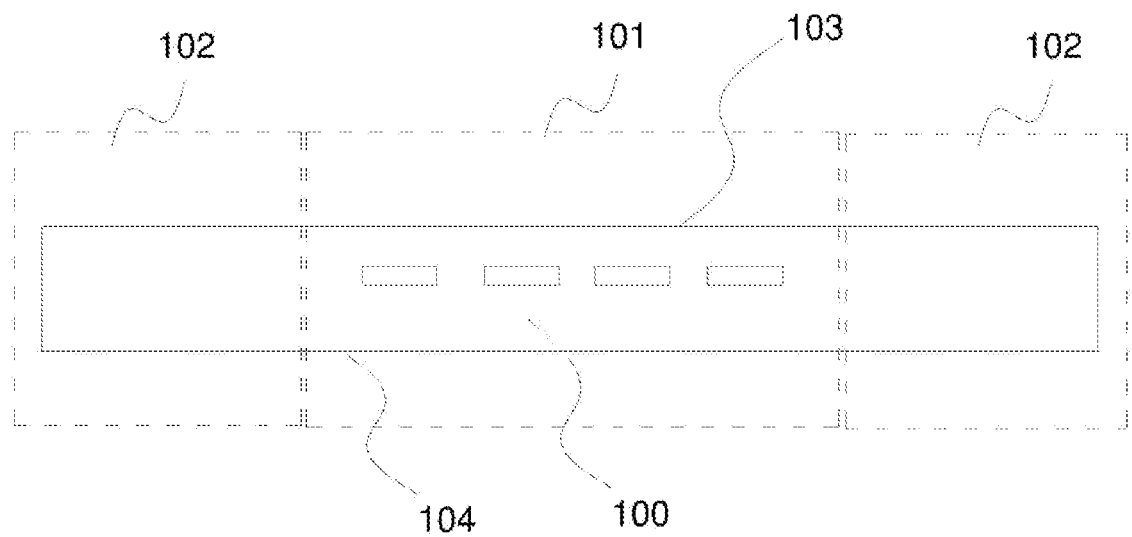
FIG. 1 is a cross-sectional view from a front view of an unshielded circuit board body according to a first embodiment of the present disclosure.
Figure 2:
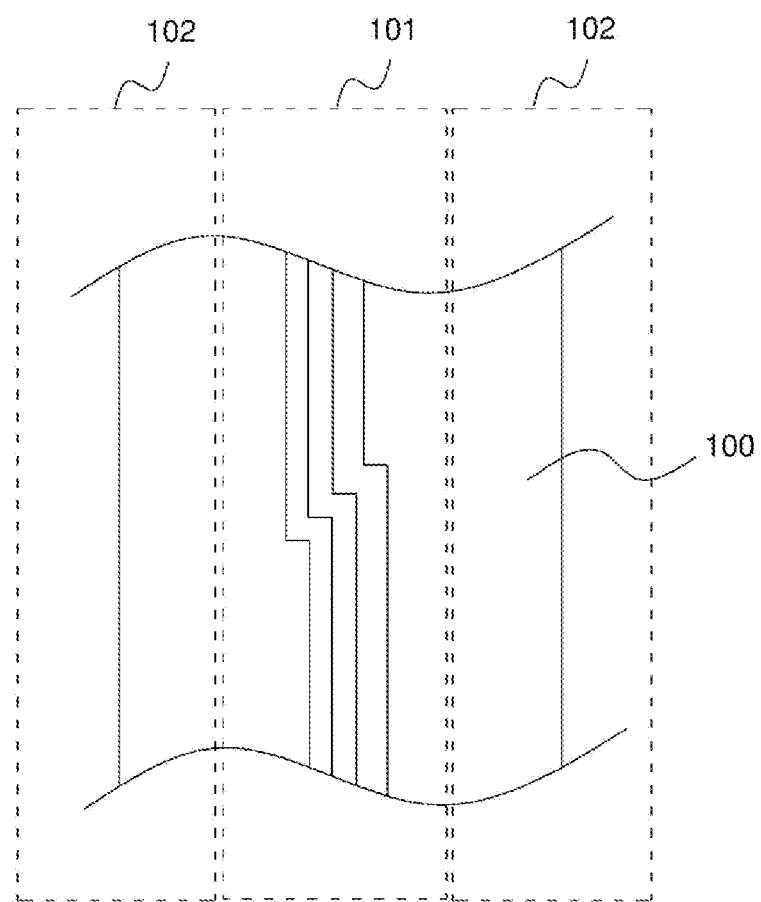
FIG. 2 is a top view of the circuit board body according to the first embodiment of the present disclosure.
Figure 3:
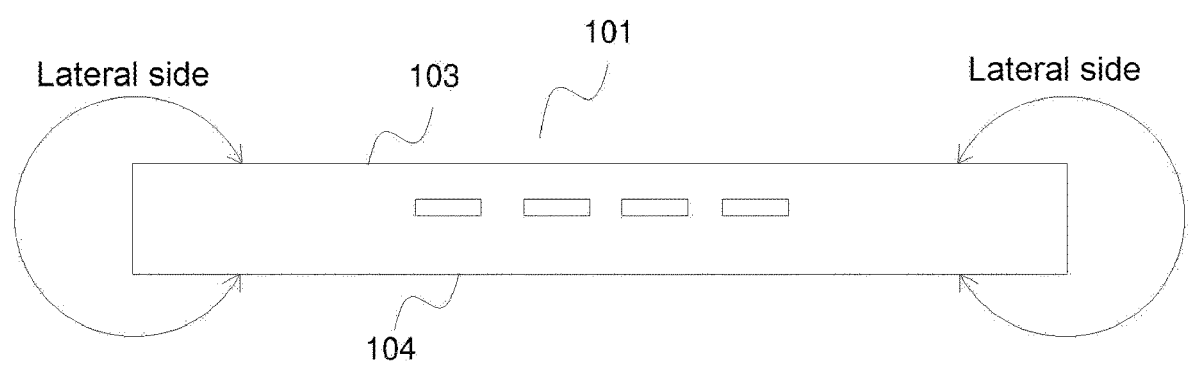
FIG. 3 is a schematic diagram I of steps of a shielding method for a circuit board for high frequency transmission according to a first embodiment of the present disclosure.

As shown in FIG. 1 and FIG. 2, a circuit board for high frequency transmission includes a first shielding film 210, a second shielding film 220, and a circuit board body 100. The circuit board body 100 includes a wire region 101 and a blank region 102. The circuit board body 100 is provided with a first surface 103 and a second surface 104. The wire region 101 refers to a region having a wire function, includes interconnection lines, and further includes a gap between the above interconnection lines. The wire region 101 represents a region that the wire function is required to be shielded at a lateral side. It cannot be understood that the wire region 101 does not include an insulation portion. The blank region 102 is relative to the wire region 101, and refers to a region capable of being provided with openings 110. Any position on the circuit board body 100 except for the wire region 101 may be considered as the blank region 102, which does not mean that there is nothing in the blank region 102 or the blank region 102 is not conductive.

A shielding method for the circuit board for high frequency transmission includes the following steps.

Figure 4:
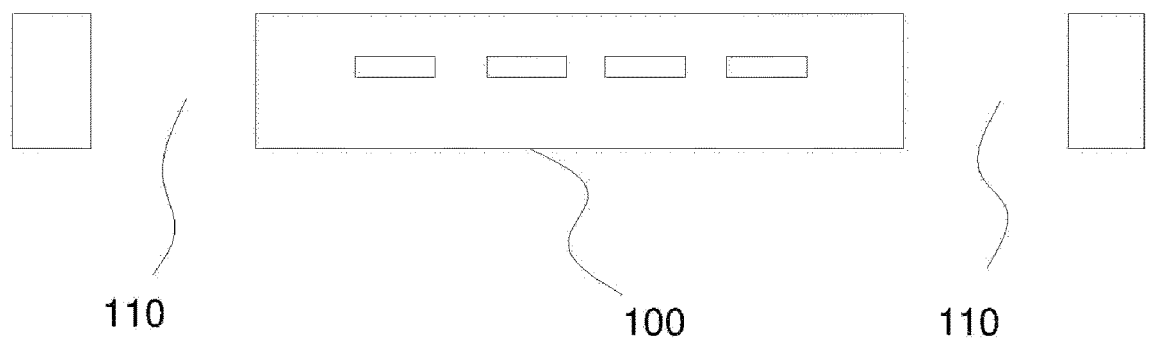
FIG. 4 is a schematic diagram II of steps of the shielding method for the circuit board for high frequency transmission according to the first embodiment of the present disclosure.
Figure 5:
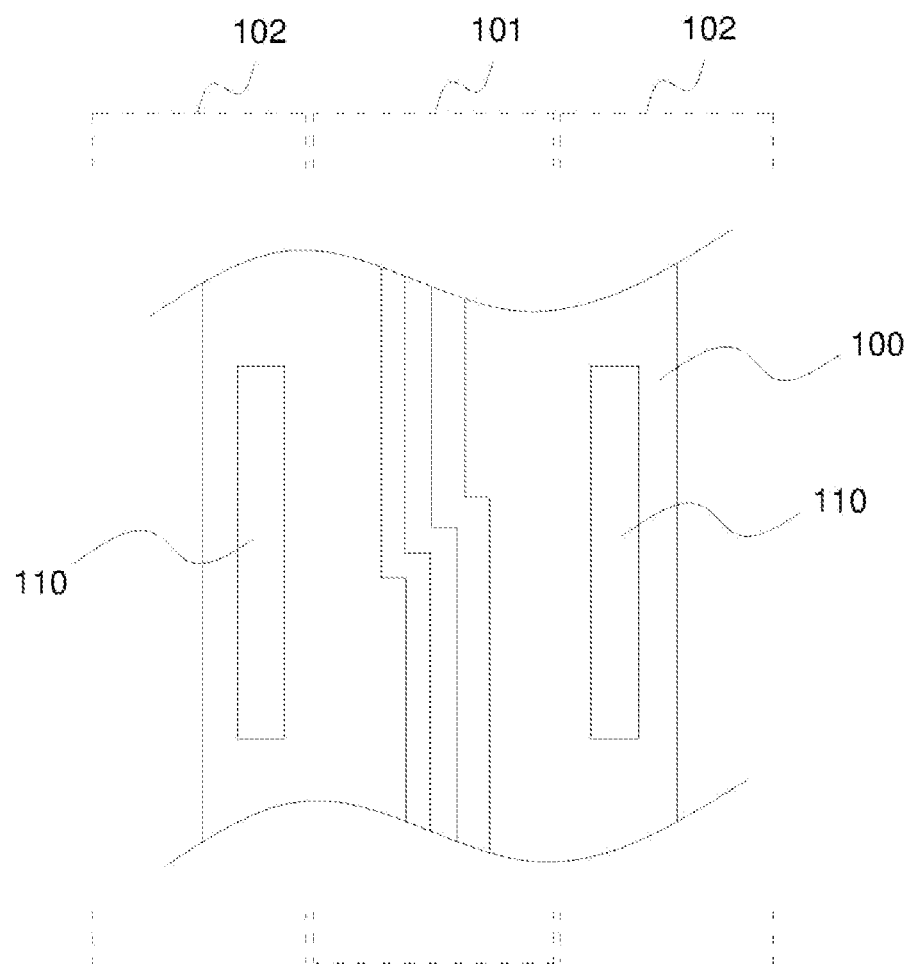
FIG. 5 is a top view of FIG. 4.

(1) As shown in FIG. 4 and FIG. 5, the blank region 102 of the circuit board body 100 is provided with the openings 110. The openings 110 communicate with the first surface 103 and the second surface 104. The openings 110 are configured to connect the first shielding film 210 and the second shielding film 220 through the openings 110. In this embodiment, the blank region 102 is provided with the openings 110, but the present disclosure is not limited herein, alternatively, in some embodiments, the circuit board body 100 has the openings 110 itself. The connection between the first shielding film 210 and the second shielding film 220 includes bonding without pressure and heating, or may further include bonding under pressure or heating.

Figure 6:
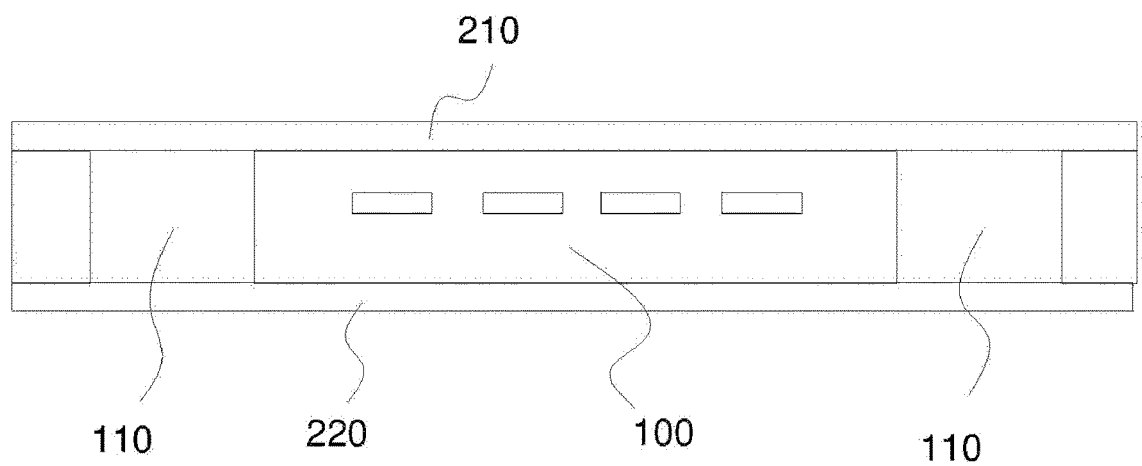
FIG. 6 is a schematic diagram III of steps of the shielding method for the circuit board for high frequency transmission according to the first embodiment of the present disclosure.

(2) As shown in FIG. 6, in some embodiments, the first shielding film 210 covers the first surface 103 of the circuit board body 100, the second shielding film 220 covers the second surface 104 of the circuit board body 100. "The operation of covering the first shielding film 210 on the first surface 103 of the circuit board body 100" and "the operation of covering the second shielding film 220 on the second surface 104 of the circuit board body 100" are in a random order.

In this embodiment, as shown in FIG. 6, the first shielding film 210 is flush with an edge of the first surface 103, and the second shielding film 220 is flush with an edge of the second surface 104, but the present disclosure is not limited herein. Alternatively, in some embodiments, referring to FIG. 11, the first shielding film 210 protrudes out of the edge of the first surface 103, and the second shielding film 220 protrudes out of the edge of the second surface 104.

Figure 7:
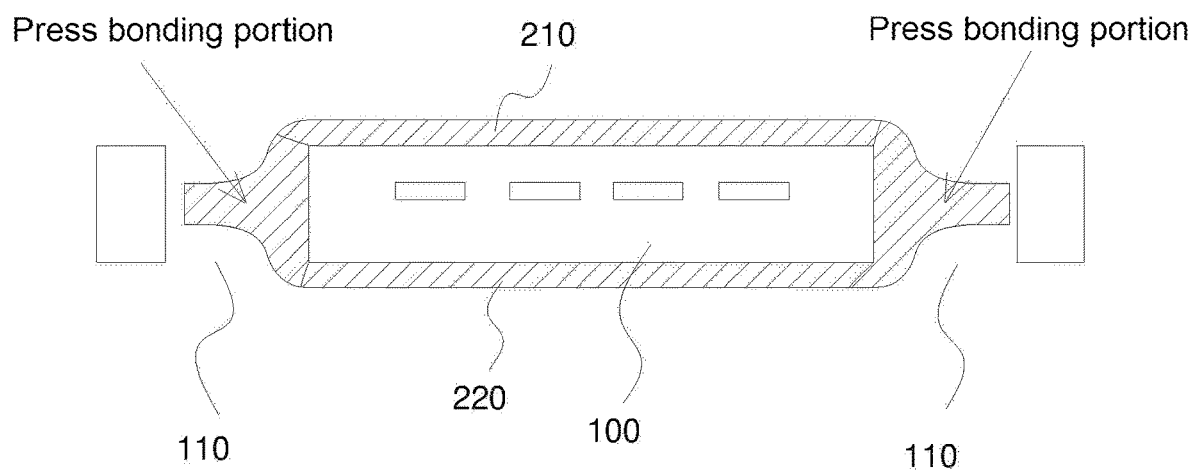
FIG. 7 is a schematic diagram IV of steps of the shielding method for the circuit board for high frequency transmission according to the first embodiment of the present disclosure.
Figures 1, 7:
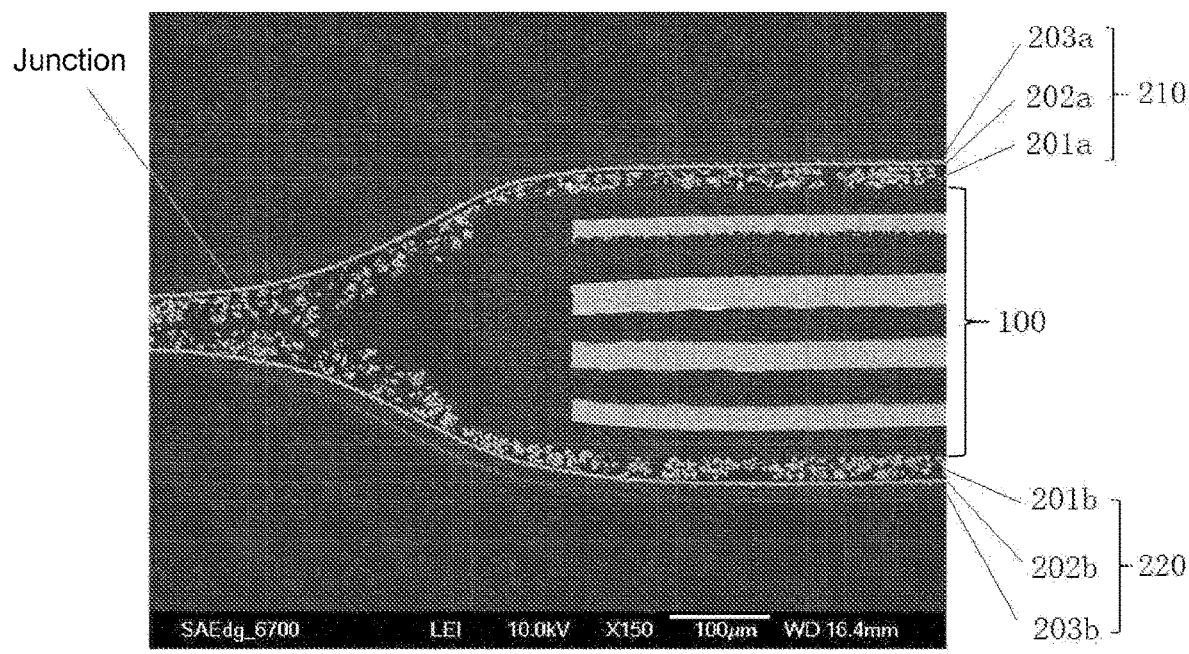
Figures 2, 7:
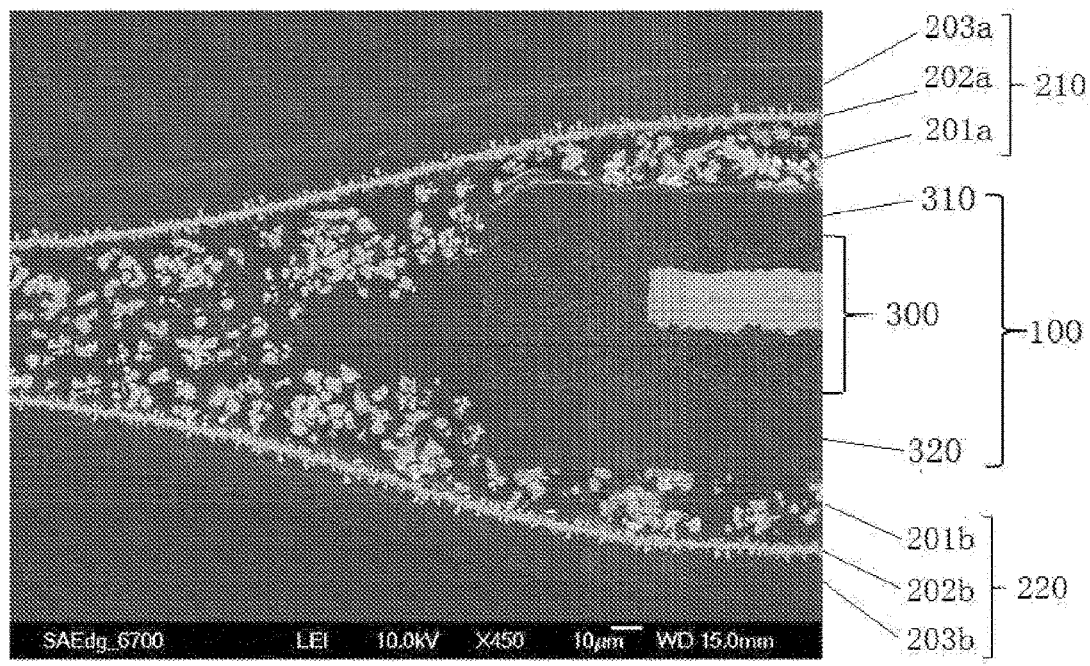
Figures 3, 7:
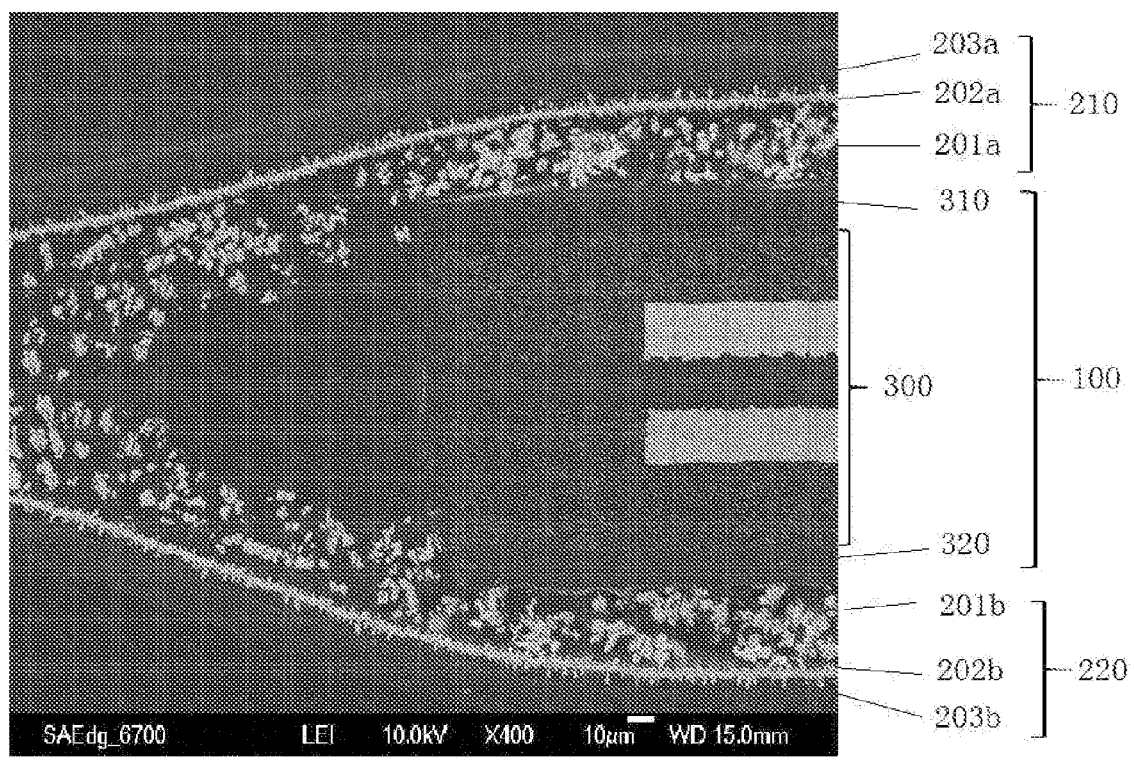

(3) The first shielding film 210 and the second shielding film 220 are connected through pressure bonding at the openings 110, so as to acquire the circuit board for high frequency transmission shown as FIG. 7. A junction of the first shielding film 210 and the second shielding film 220 is accommodated in the openings 110, so as to avoid the press bonding portion of the first shielding film 210 and the second shielding film 220 from being influenced in following processes or avoid influencing the implementation of the following processes, such as a warping of the junction. On the other hand, the press bonding portion is accommodated in the openings 110, so as to improve space utilization.

The acquired circuit board for high frequency transmission is shown as FIG. 7. The first shielding film 210 covers the first surface 103 of the circuit board body 100. The second shielding film 220 covers the second surface 104 of the circuit board body 100. The first shielding film 210 and the second shielding film 220 are connected at the lateral side of the wire region (wherein "the lateral side" includes all orientations shown in FIG. 3). On one hand, the first shielding film 210 and the second shielding film 220 respectively shield the first surface 103 and the second surface 104 of the circuit board body 100. On the other hand, the first shielding film 210 and the second shielding film 220 are connected by crossing an edge of the wire region 101, so as to shield the lateral side of the wire region 101. In this way, leakage from the lateral side of the wire region 101 is effectively prevented.

In this embodiment, the openings 110 refer to through holes. The openings 110 are in the circuit board body 100. But the present disclosure is not limited herein. In some embodiments, the openings 110 are notches. When the openings 110 are at the edge of the circuit board body 100, the openings 110 are the notches at the edge of the circuit board body 100.

In some embodiments, a binding material is disposed on a side of the first shielding film 210 that faces the first surface 103 or a side of the second shielding film 220 that faces the second surface 104, so as to achieve connection. Alternatively, pressure connection may be directly performed without disposing the binding material.

In this embodiment, the first shielding film 210 and the second shielding film 220 are two independent films. The first shielding film 210 is attached to the first surface 103 from a side of the circuit board body 100. The second shielding film 220 is attached to the second surface 104 from another side of the circuit board body 100. But the present disclosure is not limited herein. In some embodiments, the first shielding film 210 and the second shielding film 220 may also be two parts of an entire shielding film. The two parts respectively cover the first surface 103 and the second surface 104 on the two sides of the circuit board body 100 after the entire shielding film is folded in half. The part covering the first surface 103 is the first shielding film 210, and the part covering the second surface 104 is the second shielding film 220. Since one side edges of the first shielding film 210 and the second shielding film 220 are integrally connected, it is only required to connect the other sides of the first shielding film 210 and the second shielding film 220.

The shape of the junction of the first shielding film 210 and the second shielding film 220 is not limited to that shown in this embodiment, which may be in any other shapes.

This embodiment only shows one wire region 101, which is not limited herein. Alternatively, the circuit board body 100 is provided with more than two wire regions 101. A blank region 102 is disposed between the wire regions 101, and provided with at least two openings 110. The first shielding film 210 and the second shielding film 220 cover the more than two wire regions 101. The first shielding film 210 is connected with the second shielding film 220 in the openings 110. By connecting the first shielding film 210 and the second shielding film 220 in the blank region 102, the two adjacent wire regions 101 are simultaneously shielded, so as to prevent mutual interference, and leaky waves from the lateral side of the two adjacent wire regions 101 are prevented simultaneously, so that signal transmission of the two adjacent wire regions 101 is effectively guaranteed. Synchronous connection is achieved at a plurality of openings 110 of a plurality of blank regions 102, so that high production efficiency is realized. For example, in some embodiments, all openings 110 may be synchronously processed. The first shielding film 210 and the second shielding film 220 are covered. Then, the first shielding film 210 and the second shielding film 220 in all the openings 110 are synchronously connected. In this way, mass production and high efficiency are achieved.

Electrical connection between the first shielding film 210 and the second shielding film 220 at the lateral side of the wire region 101 of the circuit board body 100 includes as follows. In a first method, the shielding film includes an insulation layer, a conductive layer, and a conductive adhesive layer that are in lamination arrangement in order. In a second method, the shielding film includes an insulation layer, a conductive layer, and an adhesive layer. A protruding portion electrically connected to the conductive layer is disposed on a side of the conductive layer that is close to the adhesive layer. The protruding portion of the first shielding film penetrates the second shielding film to be electrically connected to the conductive layer of the second shielding film. The protruding portion of the second shielding film penetrates the first shielding film to be electrically connected to the conductive layer of the first shielding film. Alternatively, the protruding portion of the first shielding film is electrically connected to the protruding portion of the second shielding film. In this way, the first shielding film is electrically connected to the second shielding film through mutual contact of the protruding portions. A third method combines the first method and the second method, that is, the shielding film includes the protruding portion and the conductive adhesive layer, so that the first shielding film is electrically connected to the second shielding film through the protruding portion and conducting particles. In this embodiment, by adopting the first connecting method, as shown in FIG. 7-1, the first shielding film 210 includes an insulation layer 203a, a conductive layer 202a, and a conductive adhesive layer 201a that are in lamination arrangement in order. The second shielding film 220 includes an insulation layer 203b, a conductive layer 202b, and a conductive adhesive layer 201b that are in lamination arrangement in order. The first shielding film 210 is electrically connected to the second shielding film 220 by contact between the conductive adhesive layers 203a and 203b. Since the conductive adhesive layers 203a and 203b contain conducting particles and are viscous, so that the conductive adhesive layers may be bonded together, including bonding under pressure or heating, or bonding under normal temperature and pressure. When the conductive adhesive layers 203a and 203b are in contact with each other, respective conducting particles are in contact with each other, so as to realize electrical connection.

Figure 12:
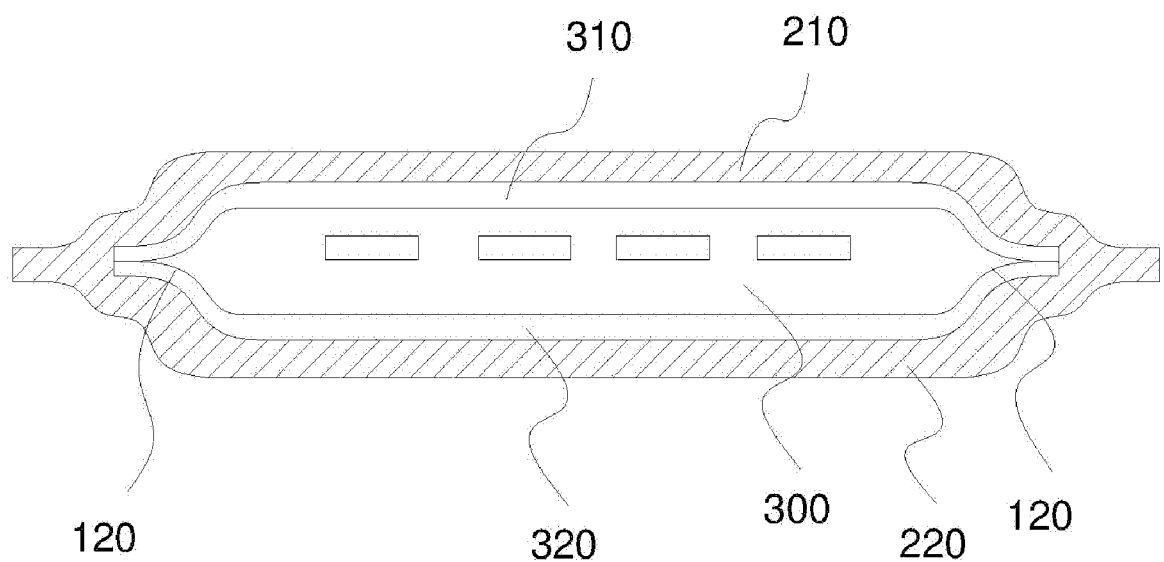
FIG. 12 is a schematic diagram III of steps of the shielding method for the circuit board for high frequency transmission according to the third embodiment of the present disclosure.

The circuit board body 100 includes but is not limited to a single sided plate, a double sided plate, and a multilayer plate, as long as circuit boards being provided with wires. In this embodiment, as shown in FIG. 7-1, the circuit board body 100 is the multilayer plate, but is not limited herein. The circuit board body 100 may also be the single sided plate or the double sided plate. As shown in FIG. 7-2, the circuit board body 100 is the single sided plate. The circuit board body 100 includes a first protective film 310, a function layer 300, and a second protective film 320 that are laminated in order. The function layer 300 is a part of the circuit board body 100 that excluding the first protective film 310 and the second protective film 320. The first protective film 310 (or the second protective film 320) includes but is not limited to a PI film, a PET film, a PE film, a PP film, a PPS film, and the like. As shown in FIG. 12-2, the circuit board body 100 is the double sided plate. The circuit board body 100 includes a first protective film 310, a first wire layer, an insulation layer, a second wire layer, and a second protective film 320 laminated in order.

Embodiment II

Figure 9:
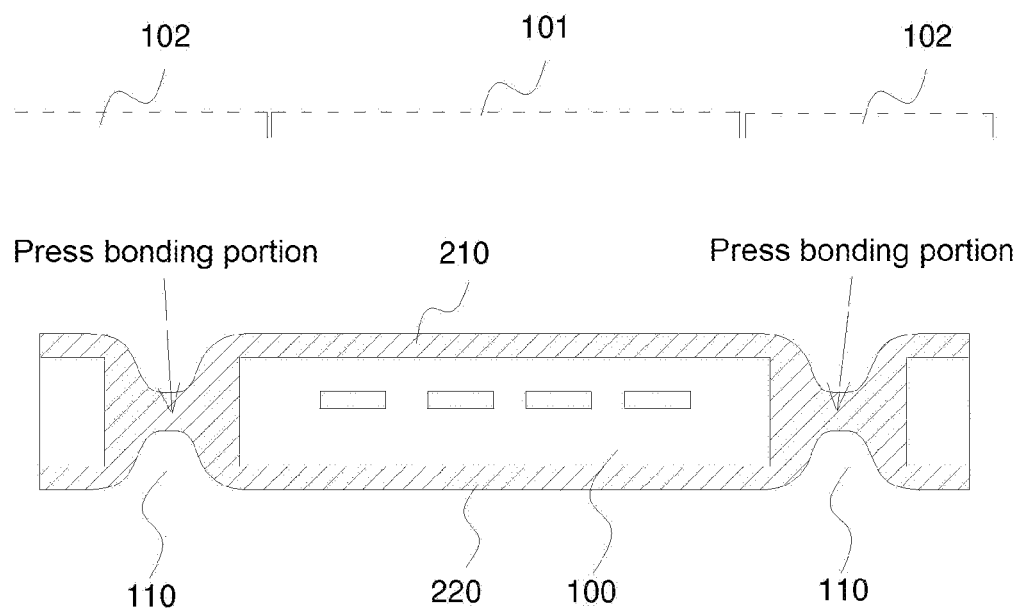
FIG. 9 is a cross-sectional view from a front view of a circuit board body according to a second embodiment of the present disclosure.

A difference between Embodiment II and Embodiment I lies in that:

as shown in FIG. 9, the blank region 102 is provided with the openings 110. The first shielding film 210 covers surfaces of the wire region 101 and the blank region 102, and is connected with the second shielding film 220 at the openings 110. The second shielding film 220 covers surfaces of the wire region 101 and the blank region 102, and is connected with the first shielding film 210 through the openings 110.

The first shielding film 210 is connected with the second shielding film 220 at the openings 110, and also covers the surfaces of the wire region 101 and the blank region 102. The second shielding film 220 is connected with the first shielding film 210 at the openings 110, and also covers the surfaces of the wire region 101 and the blank region 102. In this way, the junction of the first shielding film 210 and the second shielding film 220 is simultaneously limited by the first shielding film 210 and the second shielding film 220 in the wire region 101 and the blank region 102, which cannot be randomly moved, so as to avoid the occurrence of warping.

In this embodiment, the first shielding film 210 covers the surfaces of the wire region 101 and the blank region 102. The second shielding film 220 covers the surfaces of the wire region 101 and the blank region 102. Not limited by this embodiment, alternatively, in some embodiments, the circuit board body 100 is provided with more than two wire regions 101. The blank region 102 is disposed between the wire regions 101, and provided with the openings 110. The first shielding film 210 and the second shielding film 220 cover the more than two wire regions 101 and the blank region 102. The first shielding film 210 is connected with the second shielding film 220 through the openings 110.

Embodiment III

Figures 1, 10:
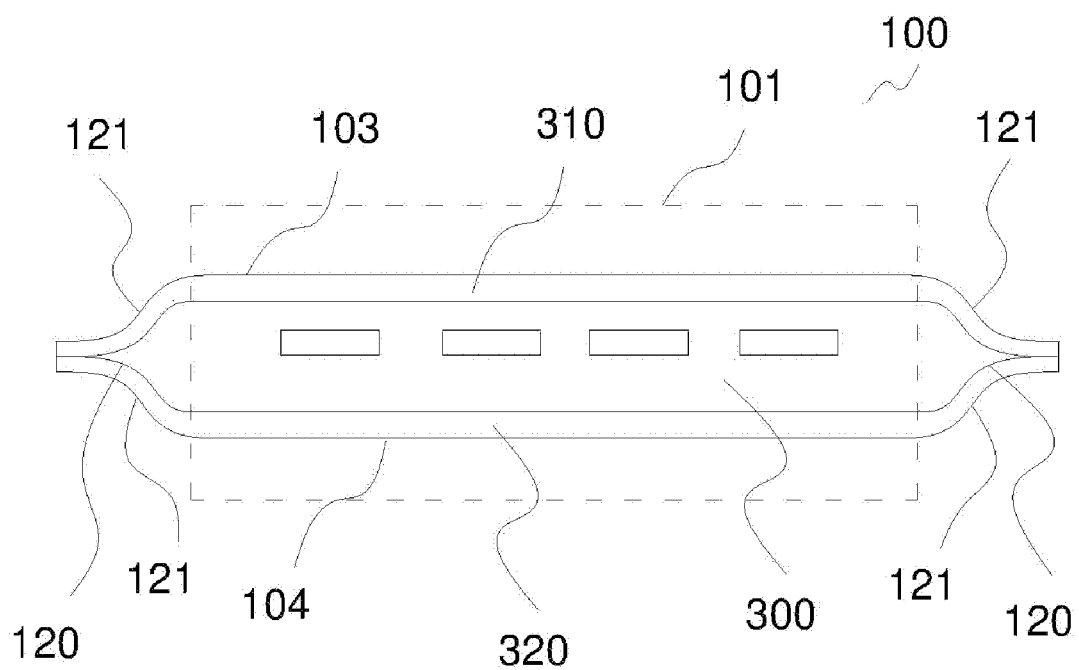
Figures 2, 10:
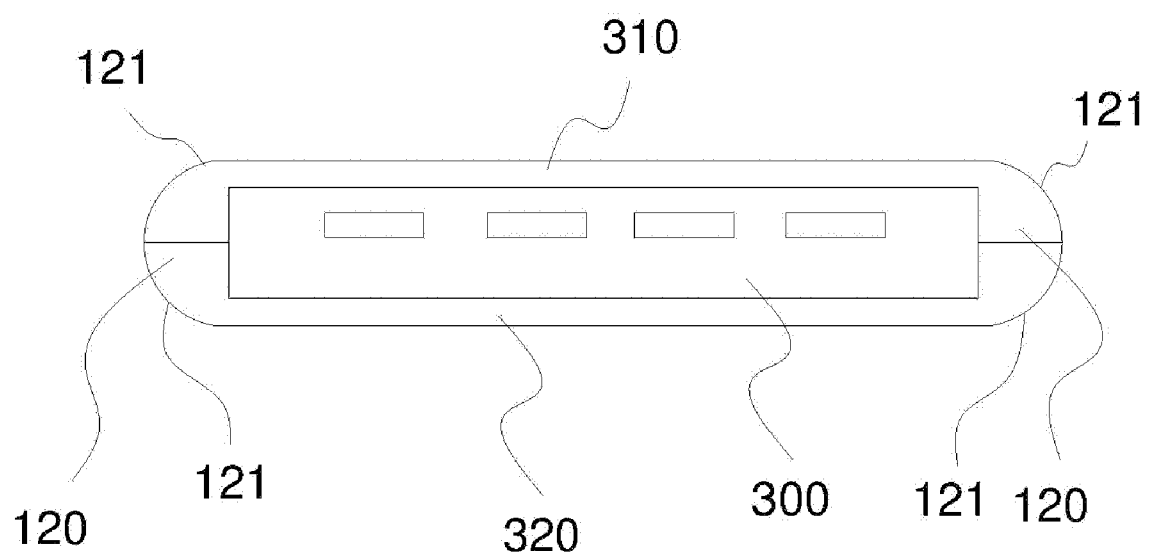
Figure 11:
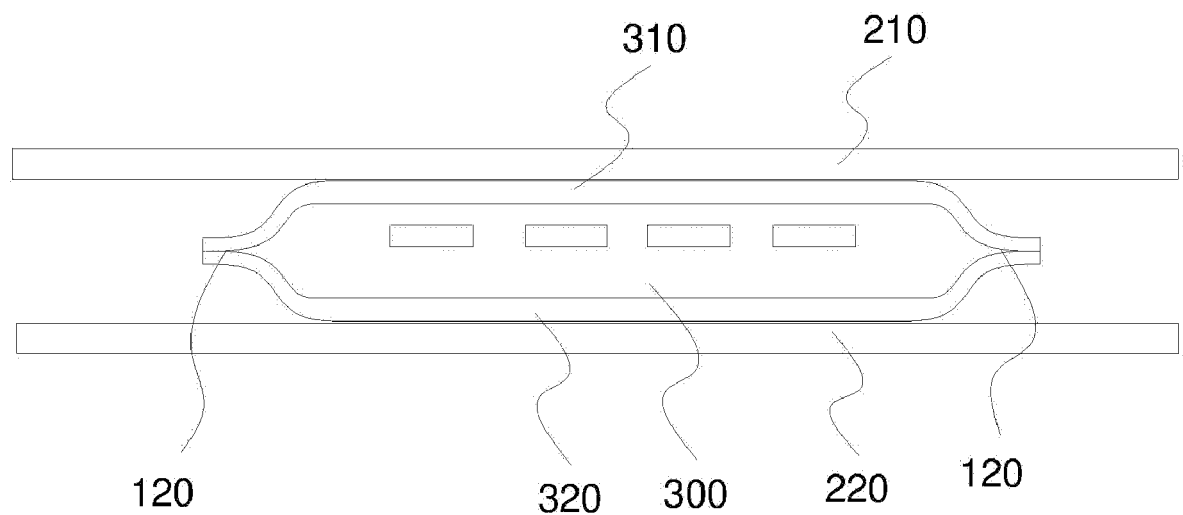
FIG. 11 is a schematic diagram II of steps of the shielding method for the circuit board for high frequency transmission according to the third embodiment of the present disclosure.

A difference between Embodiment III and Embodiment I lies in that:

Embodiment III is shown in FIG. 10 to FIG. 12.

As shown in FIG. 10-1, a circuit board body 100 includes a first protective film 310, a function layer 300, and a second protective film 320. The circuit board body 100 further includes a transition portion 120. An end of the transition portion 120 is connected to a wire region 101, and another end of the transition portion 120 is a free end. A thickness of at least one part of the transition portion 120 is less than a thickness of the wire region. In this embodiment, the thickness of the transition portion 120 is gradually reduced from a first end to a second end. However, the transition portion 120 is not limited to that shown in this embodiment, which may also be in other shapes.

As shown in FIG. 10-1, a surface of the transition portion 120 that faces a first surface 103 of the circuit board body 100 is provided with a smooth transition surface 121. The smooth transition surface 121 guides a first shielding film 210 to bend to a second shielding film 220. A surface of the transition portion 120 that faces a second surface 104 of the circuit board body 100 is also provided with a smooth transition surface 121. The smooth transition surface 121 guides the second shielding film 220 to bend to the first shielding film 210. By providing the smooth transition surface 121, the first shielding film 210/the second shielding film 220 is bent gently, so that the fracturing of the first shielding film 210/the second shielding film 220 due to excessive bending is avoided. In this embodiment, the smooth transition surface 121 only occupies parts of upper and lower surfaces of the transition portion 120, which is not limited herein. Alternatively, in some embodiments, all connecting surfaces of the transition portion 120 from the first surface 103 to the second surface 104 are designed as the smooth transition surface 121, as shown in FIG. 10-2.

As shown in FIG. 11, the first shielding film 210 covers the first surface 103, and protrudes out of an outer edge of the circuit board body 100. The second shielding film 220 covers the second surface 104, and protrudes out of the outer edge of the circuit board body 100. Then, the first shielding film 210 and the second shielding film 220 are connected at a lateral side of the circuit board body 100 (in this case, that is, the first shielding film 210 and the second shielding film 220 are connected at a lateral side of a wire region 101), so as to form a structure shown in FIG. 12. The transition portion 120 provides transitional support for the connection between the first shielding film 210 and the second shielding film 220. The circuit board body 100 and the transition portion 120 form a structure similar to steps, so as to make the first shielding film 210/the second shielding film 220 to achieve two-stage bending of "firstly bending toward the transition portion 120 and then bending and connecting from the transition portion 120", so that the bending degree of the first shielding film 210/the second shielding film 220 is reduced, and the fracturing of the first shielding film 210/the second shielding film 220 is avoided. Definitely, in some embodiments, a multi-stage transition portion 120 (similar to multi-stage steps) is disposed.

In this embodiment, the transition portion 120 is disposed on an outer edge of the circuit board body 100, which is not limited herein. In some embodiments, the transition portion 120 is disposed on an inner edge of the opening 110.

In this embodiment, the transition portion 120 is disposed on the edge of the circuit board body 100, which is not limited by this embodiment. Alternatively, in some embodiments, the transition portion 120 is not disposed on the edge of the circuit board body 100. The first shielding film 210 and the second shielding film 220 are connected at the lateral side of the circuit board body 100 (in this case, the circuit board body 100 corresponds to the wire region 101, that is, the first shielding film 210 and the second shielding film 220 are connected at the lateral side of the wire region 101).

Embodiment IV

Figure 13:
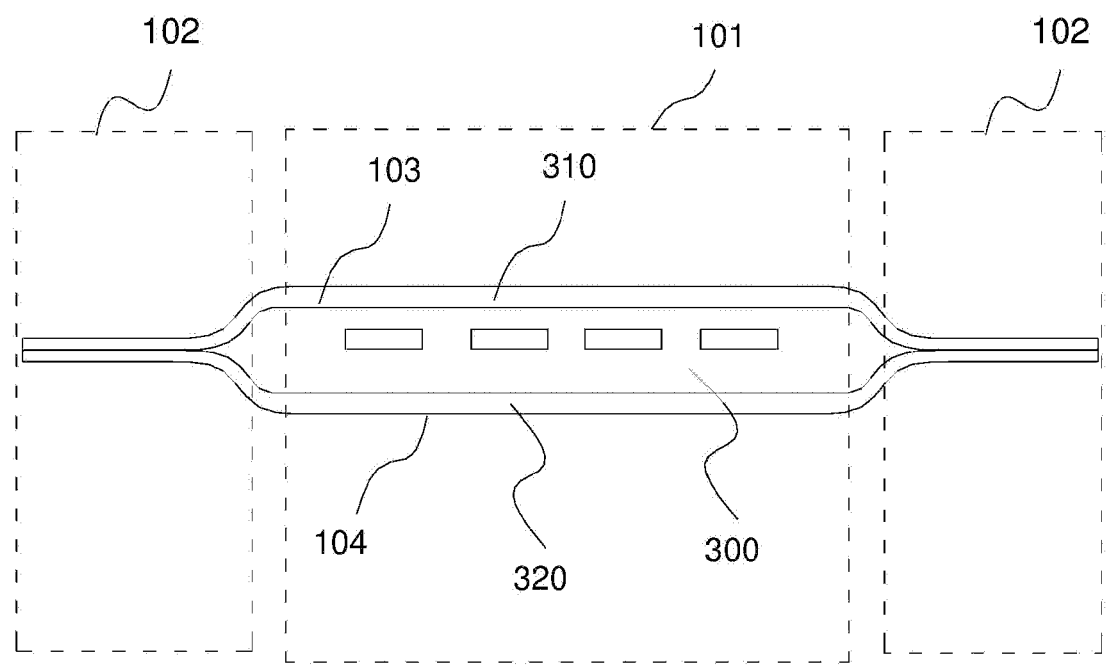
FIG. 13 is a schematic diagram I of steps of a shielding method for a circuit board for high frequency transmission according to a fourth embodiment of the present disclosure.
Figure 14:
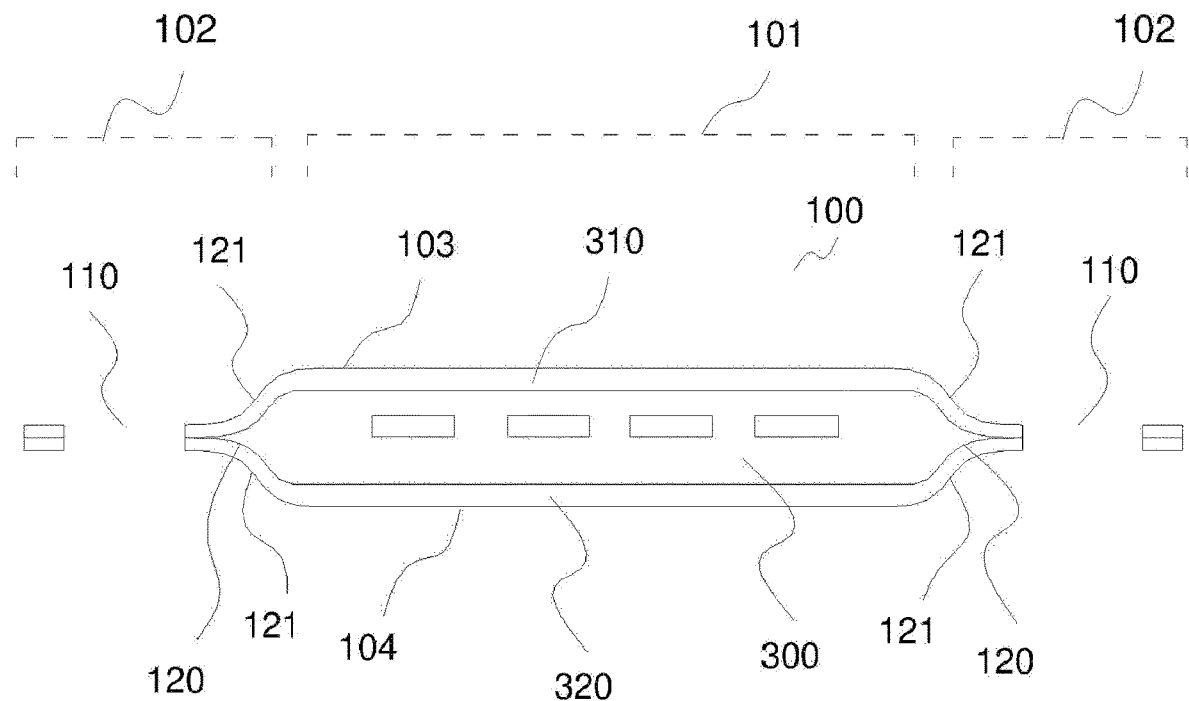
FIG. 14 is a schematic diagram II of steps of the shielding method for the circuit board for high frequency transmission according to the fourth embodiment of the present disclosure.
Figure 15:
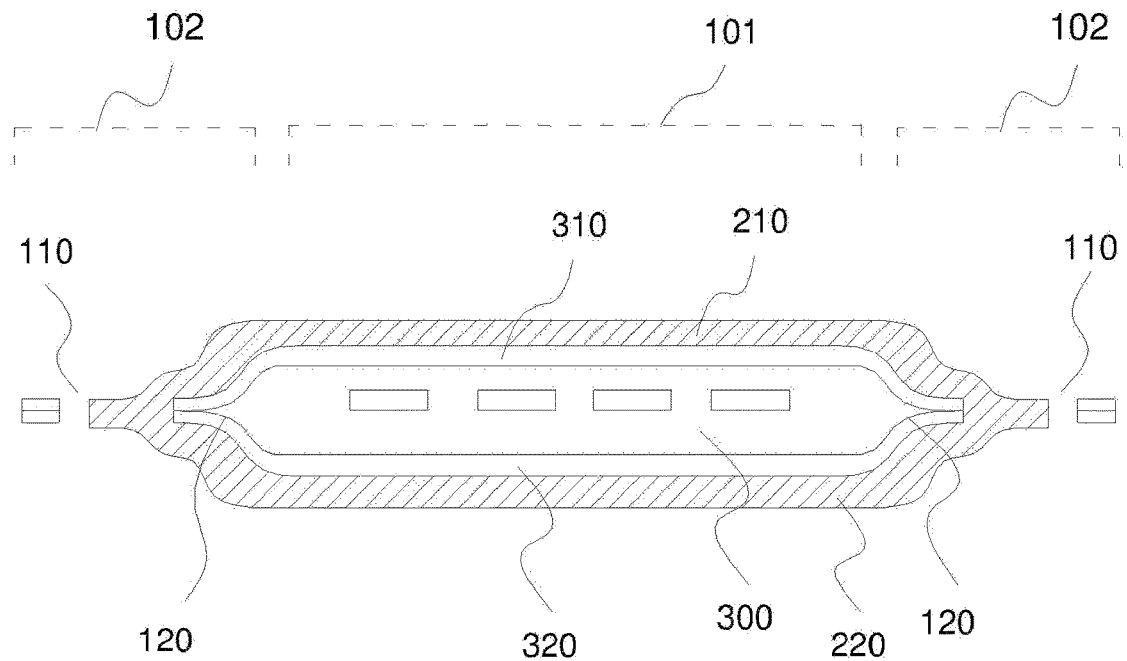
FIG. 15 is a schematic diagram III of steps of the shielding method for the circuit board for high frequency transmission according to the fourth embodiment of the present disclosure.

A difference between Embodiment IV and Embodiment III lies in that:

Embodiment IV is shown in FIG. 13 to FIG. 15.

As shown in FIG. 13, a circuit board body 100 includes a wire region 101 and a blank region 102. The circuit board body 100 includes a first protective film 310, a function layer 300, and a second protective film 320 that are laminated in order. The first protective film 310 and the second protective film 320 are connected at a lateral side of the function layer 300. A laminated part of the first protective film 310, the function layer 300, and the second protective film 320 forms the wire region 101. The part that the first protective film 310 connected to the second protective film 320 forms the blank region 102.

As shown in FIG. 14, openings 110 are manufactured in the blank region 102. After the openings 110 are manufactured, a transition portion 120 is formed by a part of a junction of the first protective film 310 and the second protective film 320 which is connected to the wire region 101. That is to say, at the connecting part with the wire region 101, a part that the first protective film 310 is connected to the second protective film 320 forms the transition portion 120. A thickness of the wire region 101 equals to "the first protective film 310+the function layer 300+the second protective film 320". A thickness of the blank region 102 equals to "the first protective film 310+the second protective film 320". The thickness of the blank region 102 is less than the thickness of the wire region 101. Therefore, the transition portion 120 is naturally formed after the openings 110 are manufactured in the blank region. In this way, when the first protective film 310 and the second protective film 320 wrap the function layer 300, the transition portion 120 is manufactured. Through a bonding connection process, simple process is realized. By connecting edges of the first protective film 310 and the second protective film 320, the first protective film 310 and the second protective film 320 are tightly attached to the function layer 300, thereby avoiding peeling off. As shown in FIG. 14, in this embodiment, a boundary line is formed at a junction of the first protective film 310 and the second protective film 320, but the present disclosure is not limited herein. In some embodiments, the pressed first protective film 310 and the second protective film 320 are penetrated into each other, and no obvious boundary lines are formed at the junction.

As shown in FIG. 15, a first shielding film 210 covers a first surface 103. A second shielding film 220 covers a second surface 104. Then, the first shielding film 210 and the second shielding film 220 are connected at a lateral side of the circuit board body 100, and a junction is accommodated in the openings 110.

Embodiment V

Figure 18:
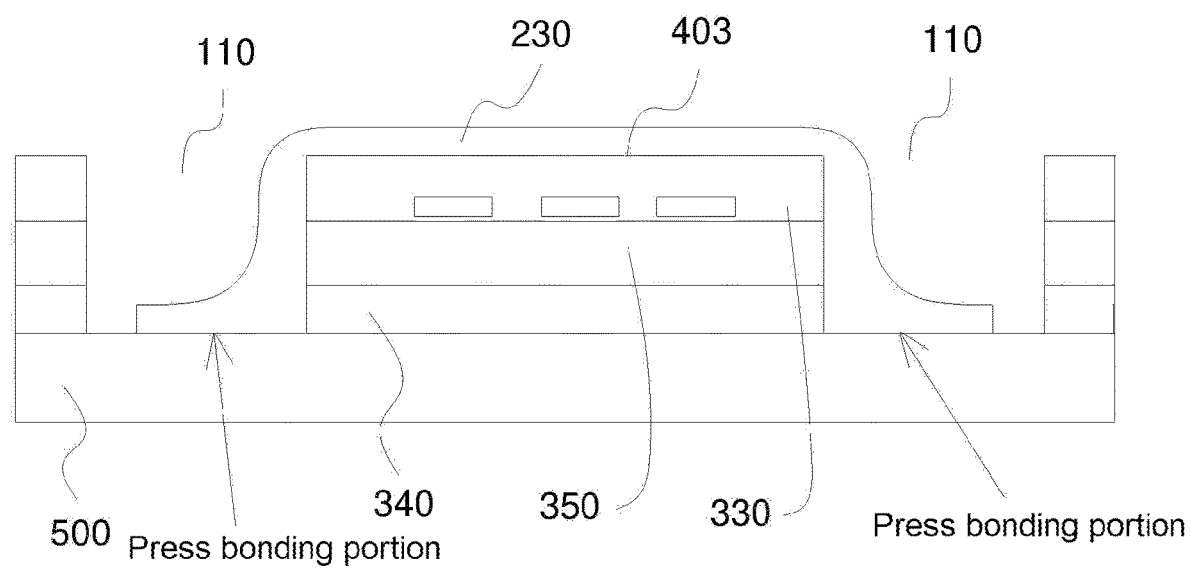
FIG. 18 is a schematic diagram III of steps of the shielding method for the circuit board for high frequency transmission according to the fifth embodiment of the present disclosure.

A difference between Embodiment V and Embodiment I lies in that:

as shown in FIG. 18, a circuit board for high frequency transmission includes a circuit board body 100 and a shielding film 230. The circuit board body 100 includes a main wire layer 400 and a conductor layer 500. The main wire layer 400 is provided with a third surface 403 and a fourth surface 404 that are arranged opposite to each other. The conductor layer 500 is disposed on the fourth surface 404. The main wire layer 400 includes a first insulation layer 340, a wire layer 350, and a second insulation layer 330 that are laminated in order. The conductor layer 500 is disposed on a surface of the first insulation layer 340 that is away from the wire layer 350, that is, the conductor layer 500 is disposed on the fourth surface 404.

The main wire layer 400 is provided with openings 110. The third surface 403 communicates with the conductor layer 500 through the openings 110. The shielding film 230 covers the third surface 403. The shielding film 230 extends into the openings 110 to achieve press connection with the conductor layer 500. The shielding film 230 is electrically connected to the conductor layer 500. The conductor layer 500 has a shielding effect itself. The shielding film 230 is in press connection with the conductor layer 500, so that leaky waves at a lateral side of the main wire layer 400 are avoided.

Figure 16:
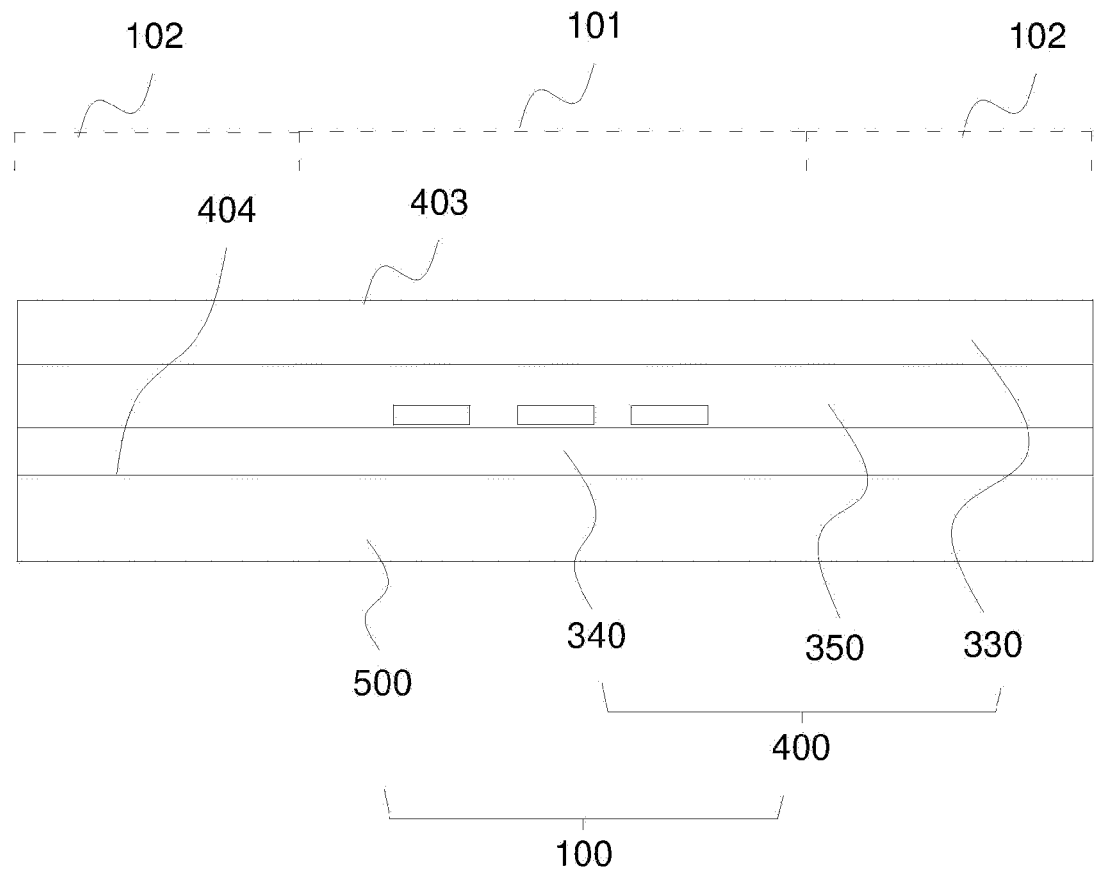
FIG. 16 is a schematic diagram I of steps of a shielding method for a circuit board for high frequency transmission according to a fifth embodiment of the present disclosure.
Figure 17:
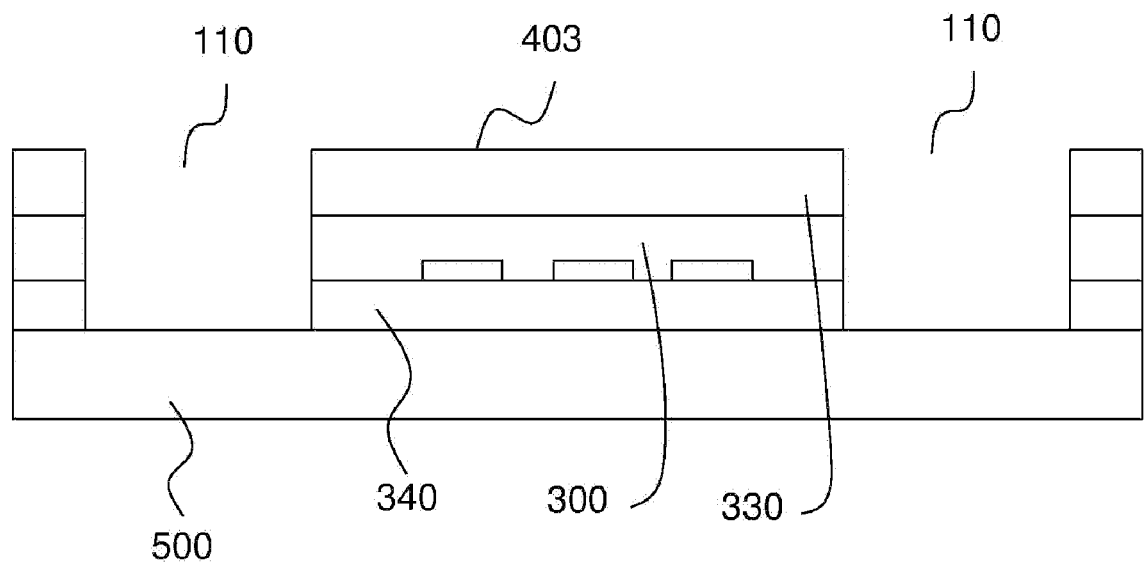
FIG. 17 is a schematic diagram II of steps of the shielding method for the circuit board for high frequency transmission according to the fifth embodiment of the present disclosure.

A shielding method for the circuit board for high frequency transmission includes the following steps, as shown in FIG. 16 to FIG. 18.

(1) As shown in FIG. 16, a circuit board body 100 includes a main wire layer 400 and a conductor layer 500. The main wire layer 400 includes a third surface 403 and a fourth surface 404 that are arranged opposite to each other. The conductor layer 500 is disposed on the fourth surface 404.

(2) As shown in FIG. 16, the circuit board body 100 includes a wire region 101 and a blank region 102. As shown in FIG. 17, openings 110 are provided in the blank region 102 of the main wire layer 400. The third surface 403 communicates with the conductor layer 500 through the openings 110.

(3) The shielding film 230 covers the third surface 403. The shielding film 230 extends into the openings 110 to achieve press connection with the conductor layer 500. The shielding film 230 is electrically connected to the conductor layer 500.

In this way, the shielding film 230 and the conductor layer 500 are in electrical connection at a lateral side of the wire region 101, so as to form a structure shown as FIG. 18, thereby shielding leaky waves at the lateral side of the wire region 101.

Various technical features of the above embodiments may be combined arbitrarily. For brevity of description, description is not made to all possible combinations of the various technical features of the above embodiments are described. However, all the combinations of these technical features should be considered to fall within the scope of disclosure contained in the specification as long as there is no contradiction between the combinations of those technical features.

The above embodiments merely illustrate several implementations of the present disclosure, which are specifically described in detail, but are not to be construed as limiting the scope of the present patent for the present disclosure.

What is claimed is:

1. A circuit board for high frequency transmission, comprising a first shielding film, a second shielding film, and a circuit board body, wherein
the circuit board body comprises a first surface and a second surface arranged opposite to each other, the first shielding film covers the first surface, the second shielding film covers the second surface, the circuit board body is provided with a wire region, the first shielding film and the second shielding film are in electrical connection at a lateral side of the wire region;
the circuit board body further comprises a transition portion, an end of the transition portion is connected to the wire region, and another end of the transition portion is a free end, a thickness of at least one part of the transition portion is less than a thickness of the wire region.

2. The circuit board for high frequency transmission as claimed in claim 1, wherein the transition portion is provided with a smooth transition surface.

3. The circuit board for high frequency transmission as claimed in claim 2, wherein the circuit board body further comprises a blank region, wherein the blank region is provided with an opening, the opening communicates the first surface and the second surface, the first shielding film is electrically connected with the second shielding film through the opening.

4. The circuit board for high frequency transmission as claimed in claim 1, wherein the first shielding film is connected with the second shielding film in a manner of bonding.

5. The circuit board for high frequency transmission as claimed in claim 4, wherein the circuit board body further comprises a blank region, wherein the blank region is provided with an opening, the opening communicates the first surface and the second surface, the first shielding film is electrically connected with the second shielding film through the opening.

6. The circuit board for high frequency transmission as claimed in claim 1, wherein the circuit board body further comprises a blank region, wherein the blank region is provided with an opening, the opening communicates the first surface and the second surface, the first shielding film is electrically connected with the second shielding film through the opening.

7. The circuit board for high frequency transmission as claimed in claim 6, wherein a junction of the first shielding film and the second shielding film is accommodated in the opening.

8. The circuit board for high frequency transmission as claimed in claim 6, wherein the first shielding film covers surfaces of the wire region and the blank region, and is connected with the second shielding film at the opening; or/and
the second shielding film covers surfaces of the wire region and the blank region, and is connected with the first shielding film at the opening.

9. The circuit board for high frequency transmission as claimed in claim 6, wherein the circuit board body is provided with more than two wire regions, the blank region is disposed between the wire regions, and is provided with the opening, the first shielding film and the second shielding film cover the more than two wire regions, the first shielding film is connected with the second shielding film through the opening.

10. The circuit board for high frequency transmission as claimed in claim 1, wherein the circuit board body further comprises a blank region, wherein the blank region is provided with an opening, the opening communicates the first surface and the second surface, the first shielding film is electrically connected with the second shielding film through the opening.

11. The circuit board for high frequency transmission as claimed in claim 1, wherein the first shielding film comprises a first insulation layer, a first conductive layer, and a first conductive adhesive layer that are in lamination arrangement in order, a first protruding portion electrically connected to the first conductive layer is disposed on a side of the first conductive layer that is close to the first conductive adhesive layer, the second shielding film comprises a second insulation layer, a second conductive layer, and a second conductive adhesive layer that are in lamination arrangement in order, a second protruding portion electrically connected to the second conductive layer is disposed on a side of the second conductive layer that is close to the second conductive adhesive layer, wherein, the first protruding portion penetrates the second shielding film to be electrically connected to the second conductive layer, or, the second protruding portion penetrates the first shielding film to be electrically connected to the first conductive layer, or, the first protruding portion is electrically connected to the second protruding portion, the first shielding film and the second shielding film realize electrical connection through conducting particles of the first conductive adhesive layer, conducting particles of the second conductive adhesive layer, the first protruding portion and the second protruding portion.

12. A circuit board for high frequency transmission, comprising a circuit board body and a shielding film, wherein the circuit board body comprises a main wire layer and a conductor layer,
the main wire layer is provided with a third surface and a fourth surface arranged opposite to each other, the conductor layer is disposed on the fourth surface, the main wire layer is provided with an opening, the third surface communicates with the conductor layer through the opening, the shielding film covers the third surface, and extends into the opening to be electrically connected with the conductor layer;
the main wire layer comprises a wire region and a transition portion, an end of the transition portion is connected to the wire region, and another end of the transition portion is a free end, a thickness of at least one part of the transition portion is less than a thickness of the wire region.

13. A shielding method for a circuit board for high frequency transmission, comprising: covering a first shielding film on a first surface of a circuit board body, covering a second shielding film on a second surface of the circuit board body, and electrically connecting the first shielding film and the second shielding film at a lateral side of a wire region of the circuit board body, the circuit board body comprises a transition portion, an end of the transition portion is connected to the wire region, and another end of the transition portion is a free end, a thickness of at least one part of the transition portion is less than a thickness of the wire region.

14. The shielding method for the circuit board for high frequency transmission as claimed in claim 13, wherein a blank region of the circuit board body is provided with an opening configured to communicate the first surface with the second surface, the first shielding film is connected with the second shielding film through the opening.

15. The shielding method for the circuit board for high frequency transmission as claimed in claim 14, wherein the shielding method further comprises: processing the opening in the blank region before the first shielding film is connected with the second shielding film.

16. The shielding method for the circuit board for high frequency transmission as claimed in claim 15, wherein the first shielding film is connected with the second shielding film in a manner of bonding.

17. The shielding method for the circuit board for high frequency transmission as claimed in claim 14, wherein the first shielding film is connected with the second shielding film in a manner of bonding.

18. The shielding method for the circuit board for high frequency transmission as claimed in claim 13, wherein the first shielding film protrudes out of an edge of the circuit board body, the second shielding film protrudes out of the edge of the circuit board body, the first shielding film and the second shielding film are in electrical connection at a lateral side of the circuit board body.

19. The shielding method for the circuit board for high frequency transmission as claimed in claim 18, wherein the first shielding film is connected with the second shielding film in a manner of bonding.

20. The shielding method for the circuit board for high frequency transmission as claimed in claim 13, wherein the first shielding film is connected with the second shielding film in a manner of bonding.

* * * * *